(12) United States Patent
He

(10) Patent No.: US 7,240,977 B2
(45) Date of Patent: Jul. 10, 2007

(54) SLIDE ASSEMBLY INCORPORATING A LATCH AND A STOP BLOCK

(75) Inventor: Ying-Jun He, Shenzhen (CN)

(73) Assignees: Hong Fu Jin Precision Industry (Shenzhen) Co., Ltd., Shenzhen (CN); Hon Hai Precision Industry Co., Ltd., Tu-Cheng (TW)

( * ) Notice: Subject to any disclaimer, the term of this patent is extended or adjusted under 35 U.S.C. 154(b) by 208 days.

(21) Appl. No.: 10/920,472

(22) Filed: Aug. 17, 2004

(65) Prior Publication Data

US 2005/0039299 A1    Feb. 24, 2005

(30) Foreign Application Priority Data

Aug. 22, 2003 (TW) .............................. 92215276 U

(51) Int. Cl.
*A47B 88/00* (2006.01)
(52) U.S. Cl. .................................. 312/333; 312/334.46
(58) Field of Classification Search ................ 312/333, 312/334.44, 334.46, 334.47, 334.1, 334.7, 312/334.8; 384/21, 22
See application file for complete search history.

(56) References Cited

U.S. PATENT DOCUMENTS

| | | | |
|---|---|---|---|
| 3,039,838 A * | 6/1962 | Koch, Jr. et al. .............. | 384/21 |
| 4,560,212 A | 12/1985 | Papp et al. | |
| 4,696,582 A * | 9/1987 | Kasten ........................... | 384/18 |
| 5,169,238 A * | 12/1992 | Schenk .......................... | 384/21 |
| 5,722,750 A | 3/1998 | Chu | |
| 6,350,001 B1 * | 2/2002 | Chu ........................ | 312/334.44 |
| 6,402,275 B1 * | 6/2002 | Yang ....................... | 312/334.46 |
| 6,685,288 B1 * | 2/2004 | MacMillan ............. | 312/334.46 |
| 6,860,574 B2 * | 3/2005 | Hwang et al. .......... | 312/334.44 |
| 6,979,065 B2 * | 12/2005 | Egger ........................... | 312/333 |
| 2001/0006319 A1 * | 7/2001 | Dopp et al. ................. | 312/333 |
| 2004/0174102 A1 * | 9/2004 | Chen et al. ............. | 312/334.46 |
| 2004/0174103 A1 * | 9/2004 | Yang ....................... | 312/334.46 |
| 2006/0043851 A1 * | 3/2006 | Lee .............................. | 312/333 |

FOREIGN PATENT DOCUMENTS

JP           2000102431       *   4/2000

* cited by examiner

*Primary Examiner*—Janet M. Wilkens
(74) *Attorney, Agent, or Firm*—Wei Te Chung

(57) ABSTRACT

A slide assembly includes an inner slide member (10), an intermediate slide member (20), an outer slide member (30) and a latch (40). The outer slide member includes a pair of stop blocks (32). The inner slide member includes two lateral walls (12). The latch is secured to an end of the intermediate slide member, and includes a pair of the body portions (44). Each body portion includes a stop end (45). When the stop ends of the latch abut against the stop blocks of the outer slide member, the intermediate slide member is stopped. The inner slide member is continuously pushed, and the lateral walls squeeze and drive the body portions toward each other. The body portions pass through the stop blocks, the intermediate slide member can be pushed further into the outer slide member.

20 Claims, 5 Drawing Sheets

SLIDE ASSEMBLY INCORPORATING A LATCH AND A STOP BLOCK

BACKGROUND OF THE INVENTION

1. Field of the Invention

The present invention relates to a slide assemble, and particular to a slide assembly comprising a lockable and removeable intermediate slide member.

2. Description of the Related Art

Slide devices are often mounted to an electronic enclosure for facilitating replacement or maintenance of inner components thereof. The slide devices allow the inner components to be easily slid into and out from the electronic enclosure.

To enable an intermediate slide member of a slide assembly to be lockable and moveable, U.S. Pat. No. 4,560,212 discloses a slide assembly incorporating a stop member. Referring to FIG. 7, the slide assembly comprises an inner slide member 60, an intermediate slide member 70, an outer slide member 80 and a stop member 72. The inner slide member 60 comprises two lateral walls 62, and is slideable within the intermediate slide member 70. The intermediate slide member 70 is slideable within the outer slide member 80. The stop member 72 is pivotally attached to an end of the intermediate slide member 70. The stop member 72 comprises a stop side 74 and a bevel 76. A spring 78 is arranged between the stop member 72 and the intermediate slide member 70. A block 82 is formed on an inner face of the outer slide member 80, corresponding to the stop member 72. The spring 78 biases the stop member 72 so that the stop end 74 abuts against the block 82, thus the intermediate slide member 70 is locked in place. The inner slide member 60 is slid toward the block 82 of the outer slide member 80, the lateral walls bias the bevel 76 of the stop member 72. Thus the stop member 72 slidingly passes over the block 82, and the intermediate slide member 70 can continue to be slid further into the outer slide member 80.

However, the slide assembly described above has several drawbacks. A spring 78 is needed to bias the stop member 72. Attachment of the spring 78 is unduly cumbersome and time consuming. Furthermore, a pair of stop members 72 having dissymmetrical configurations are needed which increases manufacturing costs.

Thus an improved slide assembly which overcomes the above-mentioned drawbacks is desired.

SUMMARY OF THE INVENTION

Accordingly, an object of the present invention is to provide a simple slide assembly incorporating a latch and a pair of stops which allows an intermediate slide member to be lockable and removeable.

To achieve the above-mentioned object, a slide assembly in accordance with the preferred embodiment of the presentation comprises an outer slide member, an intermediate slide member, an outer slide member and a latch. The outer slide member comprises a pair of stop blocks. The intermediate slide member is slideably assembled in the outer slide member. The inner slide member is slideably assembled in the intermediate slide member, and comprises two lateral walls. The latch is secured to an end of the intermediate slide member, and comprises a pair of the body portions and a pair of arm portions. Each body portion comprises a stop end. Each arm portion comprises a bevel edge. When the inner slide member is slidingly pushed into the outer slide member, the lateral walls of the inner slide member abut against the bevel edges of the latch, and urge the intermediate slide member to slide in the same direction. When the stop ends of the latch abut against the stop blocks of the outer slide member, the intermediate slide member is stopped, the inner slide member is continuously pushed, and the lateral walls squeeze the bevel edge to make the body portions inwardly deformed, therefore the body portions pass through the stop blocks, the intermediate slide member can be urged further into the outer slide member.

Other objects, advantages and novel features of the present invention will be drawn from the following detailed description of a preferred embodiment of the present invention with attached drawings, in which:

DETAIL DESCRIPTION OF THE INVENTION

Figure 1:
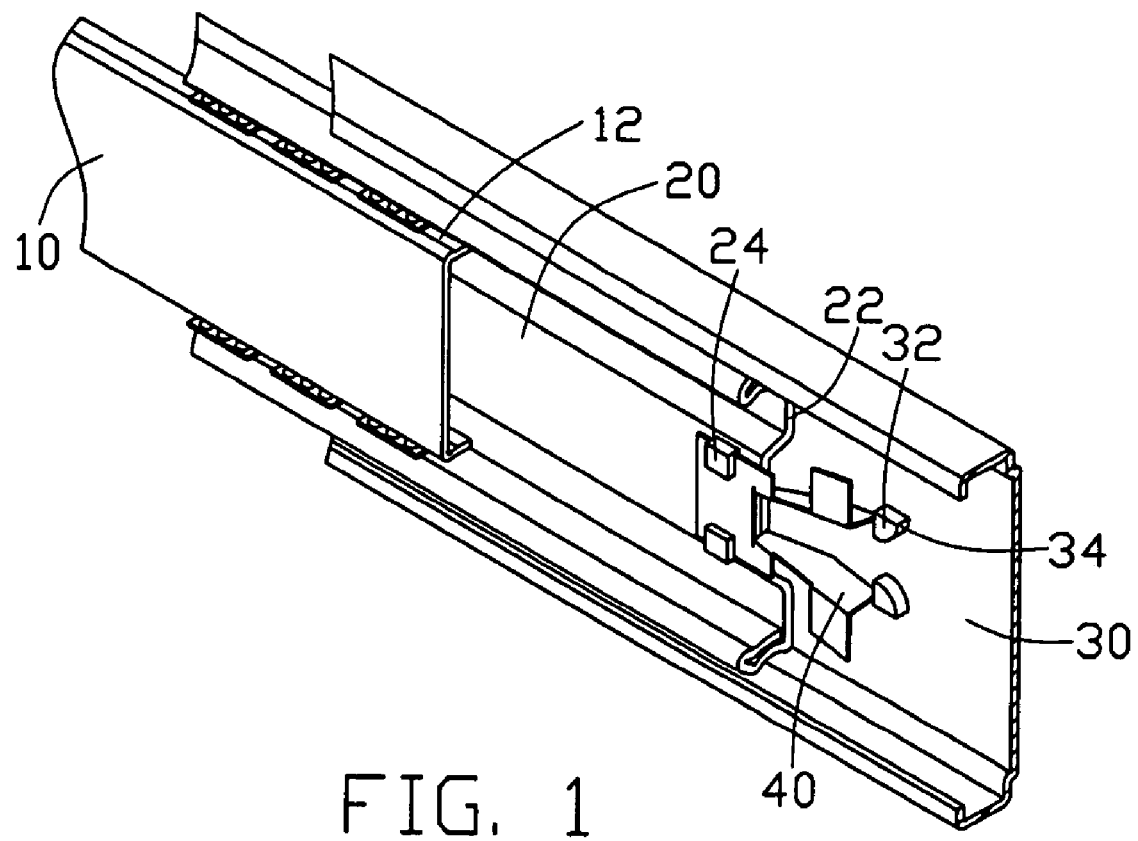
FIG. 1 is an isometric view of a slide assembly in accordance with the preferred embodiment of the present invention.

Referring to FIG. 1, a slide assembly in accordance with the preferred embodiment of the present invention comprises an inner slide member 10, an intermediate slide member 20, an outer slide member 30 and a latch 40.

The inner slide member 10 comprises a pair of lateral walls 12. The intermediate slide member 20 comprises an end 22. A pair of tabs 24 is formed on art inner face of the intermediate slide member 20 near the end 22. A pair of stop blocks 32 is formed on an inner face of the outer slide member 30. Each stop block 32 comprises a camber surface 34 and a flat surface (not labeled) adjoining to the camber surface 34 and facing the end 22 of the intermediate slide member 20.

Figure 2:
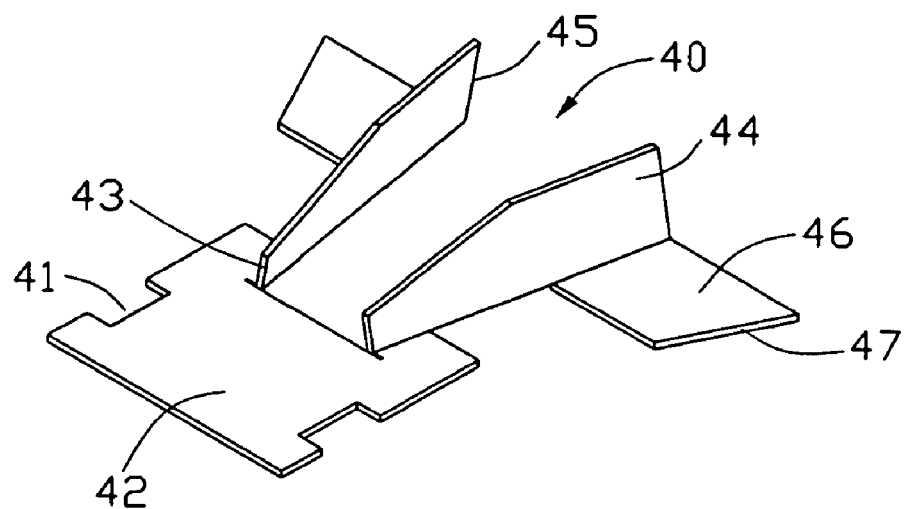
FIG. 2 is an enlarged, isometric view of a latch of the slide assembly of FIG. 1, but viewed from another aspect.
Figure 3:
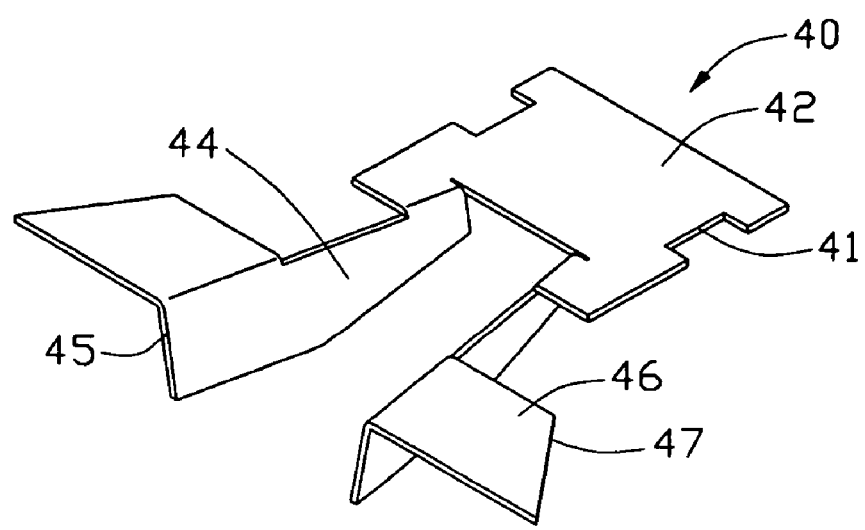
FIG. 3 is similar to FIG. 2, but viewed from another aspect.

Referring also to FIGS. 2–3, the latch 40 is made of elastic material. The latch 40 comprises, in sequence, a head portion 42, a pair of unparallel body portions 44 and a pair of arm portions 46. The head portion 42 defines a pair of cutouts 41 in opposite sides thereof, corresponding to the tabs 24 of the intermediate slide member 20. The body portion 44 are bent upwardly perpendicular to the head portion 42. Each body portion 44 comprises a locating end 43 adjoining the head portion 42 and a stop end 45 opposing the locating ends 43. The stop ends 45 may be flat and resist the flat surfaces of the stop blocks 32 of the outer slide member 30. The width between the body portions 44 at the locating ends 43 is less than the width between the body portions 44 at the stop ends 45. The arm portions 46 are bend outwardly from the body portions 44. The arm portions 46 are coplanar with the head portion 42. Each arm portion 46 comprises a bevel edge 47.

Figure 4:
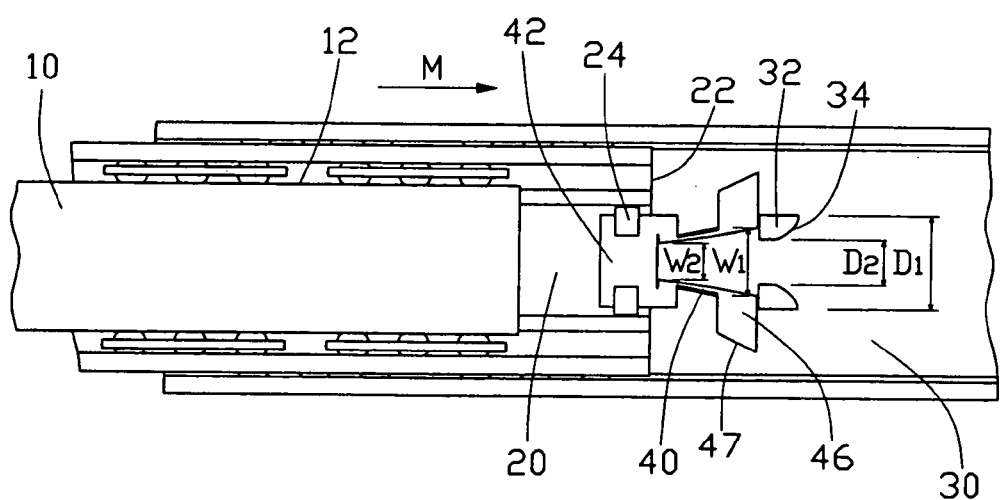
FIG. 4 is a plain view of FIG. 1.

Referring also to FIG. 4, The intermediate member 20 is slidingly assembled in the outer slide member 30, and the inner slide member 10 is slidingly assembled in the intermediate member 20. The latch 40 is attached to the inner face of the intermediate member 20, with the locating ends 43 of the body portion 44 abutting the end 22 of the intermediate slide member 20. Simultaneously, the tabs 24 of the intermediate slide member 20 extended through the cutouts 41 of the head portion 42. The two tabs 24 are then stamped toward each other, therefore securing the latch 40 to the intermediate member 20.

In the present invention, a width W1 between the body portions 44 at the stop ends 45 is less than a maximum width D1 between the camber surfaces 34 of the stop blocks 32, but greater than a minimum width D2 between the camber surfaces 34 of the stop blocks 32. Therefore, the body portions 44 of the latch 40 abut against the stop blocks 32 at the stop ends 45. Thus the latch 40 is prevented from being slid further into the outer slide member 30. A width W2 between body portions 44 at the locating ends 43 is less than the width W1, for facilitating the body portions 44 to be slid through the stop blocks 32.

Figure 5:
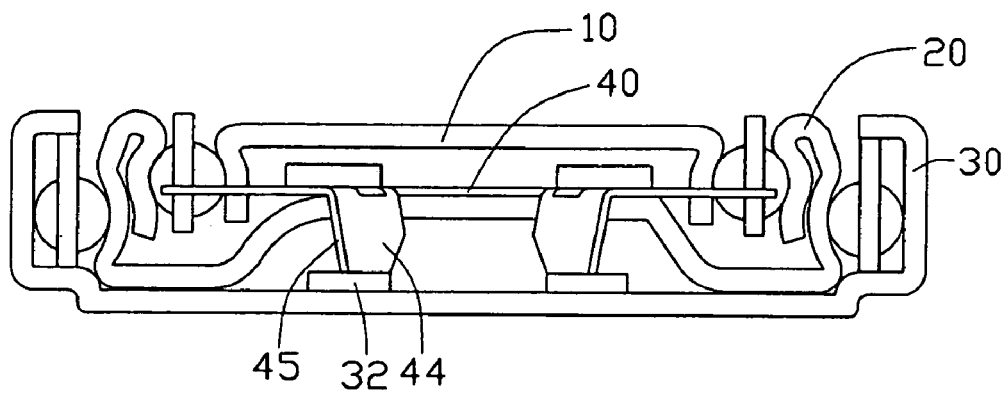
FIG. 5 is a right side view of FIG. 4, showing the latch is blocked by a pair of stop blocks.
Figure 6:
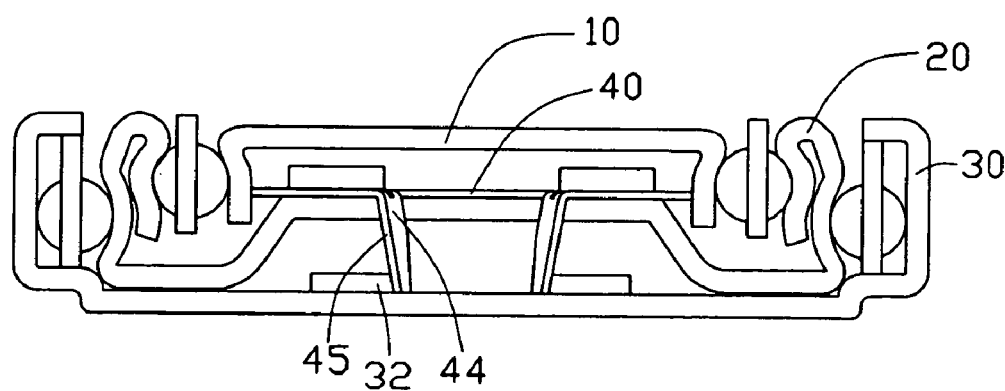
FIG. 6 is similar to FIG. 5, but showing the latch is pushed through the stop blocks.
Figure 7:
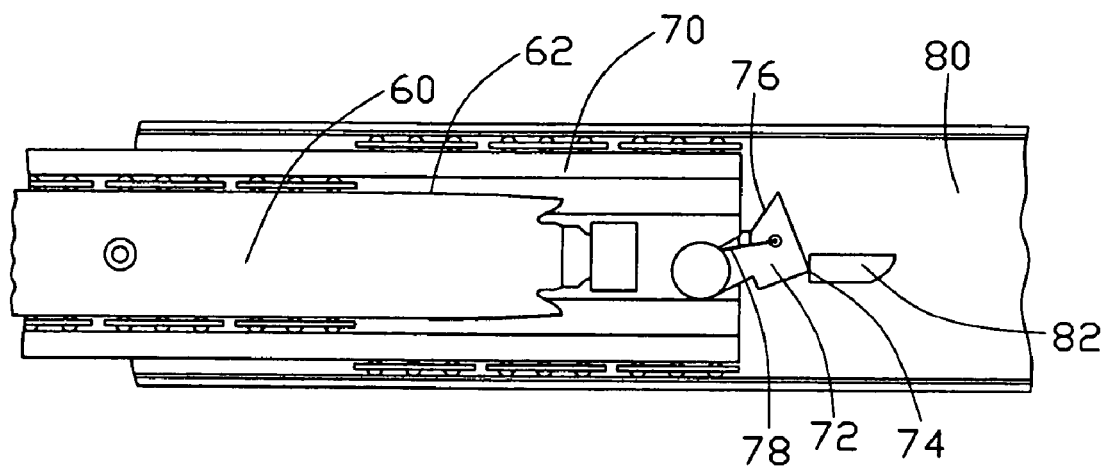
FIG. 7 is a schematic plan view of a conventional slide assembly.

Referring also to FIGS. 5–6, when the inner slide member 10 is pushed in direction M, the lateral walls 12 of the inner slide member 10 abut the bevel edges 47 of the arm portions 46 of the latch 40, and urge the intermediate slide member 20 to slide in the same direction, until the stop ends 45 of the body portions 44 are blocked by the stop blocks 32 of the outer slide member 30. The inner slide member 10 is continuously pushed, such that the lateral walls 12 of the inner slide member 10 inwardly squeeze the bevel edges 47 of the arm portions 46. Thus the width W1 decreases. When the decreased width W1 is less than the width D2, the body portions 44 of the latch 40 are slidingly pushed through the stop blocks 32. Thus the intermediate slide member 20 can be slid further into the outer slide member 30.

When the inner slide member 10 is drawn out from the outer slide member 30 in an direction opposing M, the intermediate slide member 20 slides in the same direction because of the bevel edges 47 of the arm portions 46 firmly abutting against inner surfaces of the lateral walls 12 of tile inner slide member 10. Since the width W2 is less than the width D2, the body portions 44 of the latch 40 easily slide through the camber surfaces 34. The intermediate slide member 20 is locked in place by conventional means (not shown) after the latch 40 fully slides through the stop blocks 32. The inner slide member 10 continues sliding in order to be disengaged from the bevel edges 47 of the latch 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to full extent indicated by the broad general meaning of the terms in which the appended claims are expressed.

What is claimed is:

1. A slide assembly comprising:
   an outer slide member comprising a pair of stop blocks;
   an intermediate slide member being slideably assembled in the outer slide member;
   an inner slide member being slideably assembled in the intermediate slide member, the inner slide member comprising a pair of lateral walls; and
   a latch secured to an end of the intermediate slide member, the latch comprising a pair of body portions and a pair of arm portions, each of the body portions comprising a stop end, each of the arm portions comprising a bevel edge; wherein when the inner slide member is slidingly pushed into the outer slide member, the lateral walls of the inner slide member abut against the bevel edges of the latch, and urge the intermediate slide member to slide in the same direction, and when the stop ends of the latch abut against the stop blocks of the outer slide member, the intermediate slide member is stopped, the inner slide member is pushed continuously, and the lateral walls squeeze the bevel edges to make the body portions inwardly deformed, therefore the body portions pass through the stop blocks, and the intermediate slide member is urged further into the outer slide member.

2. The slide assembly as described in claim 1, wherein each of the stop blocks of the outer slide member comprises a camber surface.

3. The slide assembly as described in claim 2, wherein a width between the body portions at the stop ends of the latch is less than a maximum width between the camber surfaces of the two stop blocks, but greater than a minimum width between the camber surfaces of the stop blocks.

4. The slide assembly as described in claim 2, wherein each of the body portions further comprises a locating end, and a width between the body portions at the locating ends is less than a width between the body portions at the stop ends.

5. The slide assembly as described in claim 4, wherein the width between the body portions at the locating ends is less than the minimum width between the camber surfaces of the two stop blocks.

6. The slide assembly as described in claim 1, wherein the latch further comprises a head portion adjoining the body portions, and the head portion defines a pair of cutouts in opposite sides thereof.

7. The slide assembly as described in claim 6, wherein a pair of tabs protrudes outwardly from the intermediate slide member, corresponding to the cutouts of the latch, and the tabs are engaged in the cutouts thereby securing the latch to the intermediate slide member.

8. The slide assembly as described in claim 6, wherein the arm portions of the latch are coplanar with the head portion.

9. The slide assembly as described in claim 1, wherein the arm portions are perpendicularly and outwardly bent from the body portions respectively.

10. A slide assembly comprising:
    a stationary first slide member extending along a lengthwise direction and comprising at least one stop block;
    a moveable second slide member extending along said lengthwise direction and being slideably assembled in the first slide member;
    a latch secured to the second slide member and facing toward the first slide member in a lateral direction perpendicular to said lengthwise direction, the latch comprising a head portion secured to the second slide member, a deflectable body portion connected to the head portion, and a stop end formed at a free end of the body portion, the head portion, the body portion and the stop end being substantially aligned along the lengthwise direction; wherein
    in assembling, the second slide member moves forwardly along the lengthwise direction relative to the first slide member under a condition that the body portion is deflected in a vertical direction perpendicular to both said lengthwise direction and said lateral direction by confrontation with the at least one stop block, and successively is outwardly resumed once the stop end passes the at least one stop block; and in operation, the second slide member is rearwardly slidable relative to the first slide member until the stop end abuts against the at least one stop block.

11. The slide assembly of claim 10, wherein the at least one stop block of the first slide member has a flat surface facing the second slide member, and the stop end of the body portion of the latch being flat abuts against the flat surface of the at least one stop block of the first slide member.

12. The slide assembly of claim 10, further comprising a third slide member having a lateral wall slideably assembled in the second slide member, wherein the latch further comprises an arm portion being outwardly bent from the body portion, the third slide member is pushed rearwardly relative to the first slide member, and the lateral wall of the third slide member squeezes the arm portion to make the body portion inwardly deformed.

13. The slide assembly of claim 10, wherein the latch is secured to the second slide member by a tab protruding from the second slide member.

14. A slide assembly comprising:
- a stationary first slide member extending along a lengthwise direction and comprising a stop block;
- a moveable second slide member extending along said lengthwise direction and slideably coupled to the first slide member; and
- a latch secured to the second slide member, the latch comprising a deflectable body portion with a stop end, and an arm portion connected to the body portion, the body portion extending substantially along the lengthwise direction;

wherein the second slide member is slidable forward along said lengthwise direction relative to the first slide member under a condition that the body portion is deflected by confrontation with the stop block in a manner so as to allow the latch to pass the slop block, and successively is resumed with the stop end abutting against the stop block once the stop end passes the stop block;

wherein the second slide member is slidable rearward along said lengthwise direction relative to the first slide member when the arm portion is pushed in a manner so as to deflect the body portion to allow the latch to pass the stop block, and the body portion successively is resumed once the stop end passes the stop block.

15. The slide assembly of claim 14, wherein the distance between the arm portion and the first slide member is greater than the height of the stop block projecting from the first slide member toward the second slide member.

16. The slide assembly of claim 14, wherein the latch is made from a single piece of resilient material.

17. The slide assembly of claim 16, wherein the latch has a head portion secured to the second slide member, and the arm portion is coplanar with the head portion.

18. The slide assembly of claim 14, further comprising a movable third slide member extending along said lengthwise direction and slideably coupled to the second slide member, wherein the third slide member has a lateral wall configured for pushing the arm portion to deflect the body portion when the third slide member slides rearward.

19. The slide assembly of claim 17, wherein the body portion has a locating end adjoining the head portion, the latch further includes another deflectable body portion with another stop end, a width between the body portion and the another body portion adjacent to the locating end is less than that adjacent to the stop end, and the first slide member further includes another stop block for engaging with the another body portion and the another stop end as with the body portion and the top end.

20. The slide assembly of claim 14, wherein the arm portion forms a bevel edge for being pushed.

* * * * *